United States Patent [19]

Ito et al.

[11] Patent Number: 5,459,337
[45] Date of Patent: Oct. 17, 1995

[54] SEMICONDUCTOR DISPLAY DEVICE WITH RED, GREEN AND BLUE EMISSION

[75] Inventors: Satoshi Ito; Futoshi Hiei; Akira Ishibashi; Atsushi Toda; Norikazu Nakayama, all of Kanagawa, Japan

[73] Assignee: Sony Corporation, Tokyo, Japan

[21] Appl. No.: 197,310

[22] Filed: Feb. 16, 1994

[30] Foreign Application Priority Data

Feb. 19, 1993 [JP] Japan .................................. 5-030560
Feb. 26, 1993 [JP] Japan .................................. 5-038899

[51] Int. Cl.[6] .................................................. H01L 33/00
[52] U.S. Cl. ........................... 257/89; 257/90; 257/96; 257/97; 372/50; 372/43
[58] Field of Search ......................... 257/13, 88, 89, 257/94, 95, 96, 97; 372/50, 43

[56] References Cited

U.S. PATENT DOCUMENTS

| | | | |
|---|---|---|---|
| 4,992,837 | 2/1991 | Sakai et al. | 257/97 X |
| 5,010,376 | 4/1991 | Nishimura et al. | 257/94 |
| 5,296,718 | 3/1994 | Fujita et al. | 257/94 X |
| 5,324,963 | 6/1994 | Kamata | 257/96 |

FOREIGN PATENT DOCUMENTS

| | | | |
|---|---|---|---|
| 5946073 | 3/1984 | Japan | 257/13 |
| 2283079 | 11/1990 | Japan | 257/89 |

Primary Examiner—William Mintel
Attorney, Agent, or Firm—Hill, Steadman & Simpson

[57] ABSTRACT

A light emitting device and a method of fabricating the same in which a first cladding layer is formed on a substrate, then red, green and blue light emitting portions each made of II–VI semiconductor are formed in a horizontal direction with respect to a surface of the substrate on the first cladding layer, then a second cladding layer is formed on the light emitting portions, and the red, green and blue light emitting portions are electrically separated from each other so that three primary color light emitting portions of a self luminous type are formed on the same substrate through single crystal growth process by changing composition of a compound semiconductor layer.

10 Claims, 10 Drawing Sheets

F I G. 11
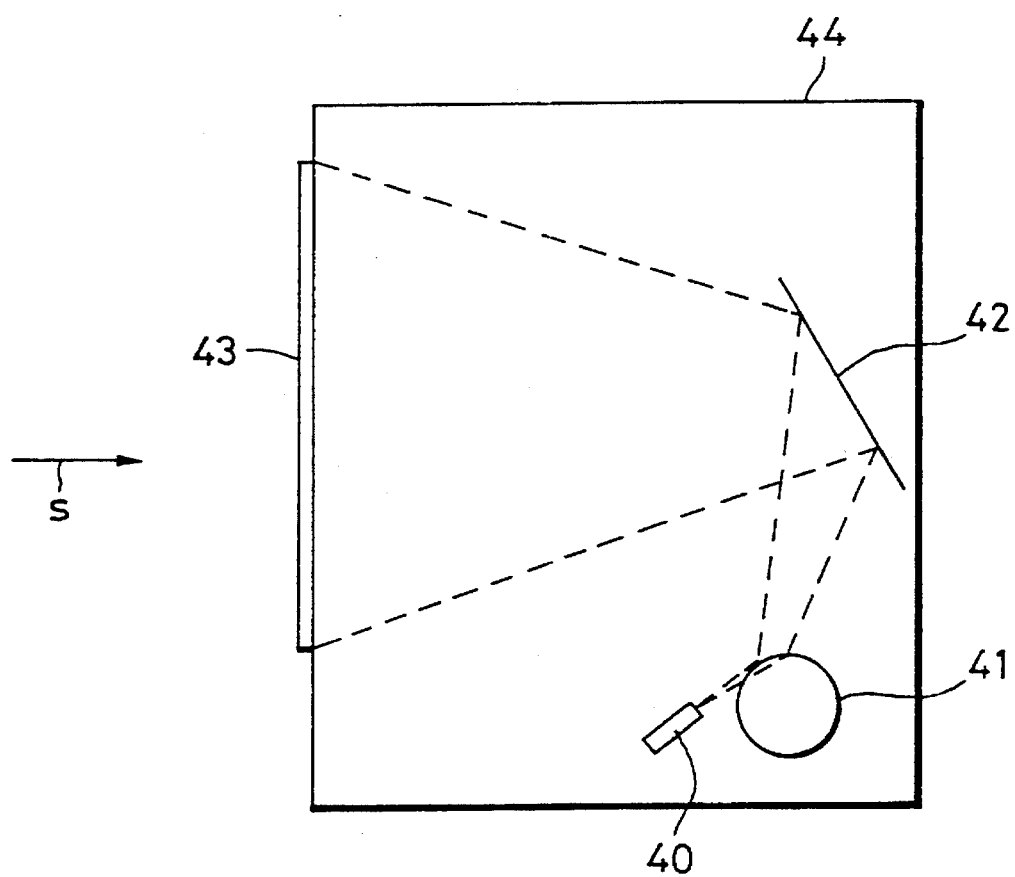

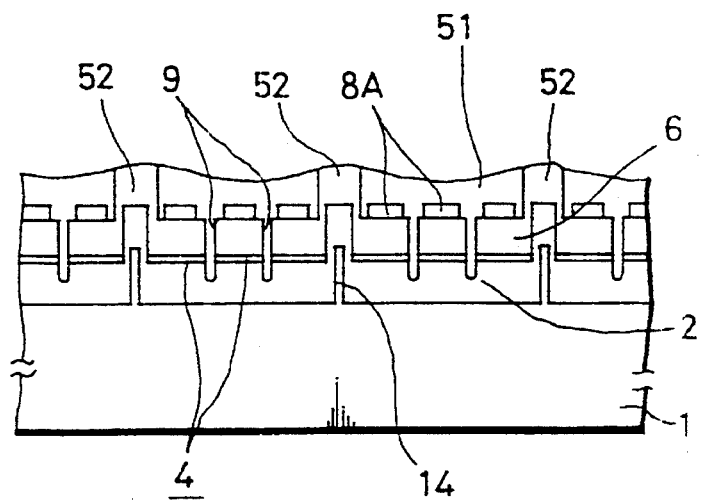
F I G. 14A
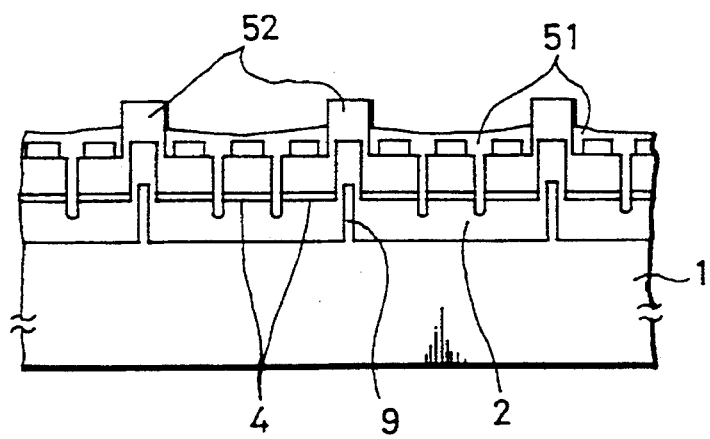
F I G. 14B
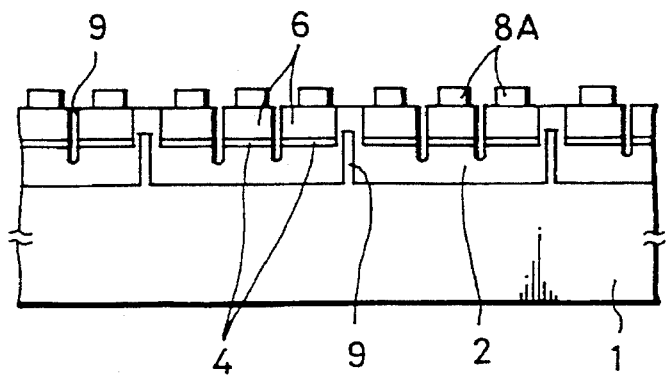
F I G. 14C

SEMICONDUCTOR DISPLAY DEVICE WITH RED, GREEN AND BLUE EMISSION

BACKGROUND OF THE INVENTION

1. Field of the Invention

The present invention generally relates to semiconductor display devices and, more particularly, is directed to a semiconductor display device which can effect color display by energizing self luminous elements of three primary color lights, i.e., red (R), green (G) and blue (B) lights.

2. Description of the Related Art

A red light emitting element is fabricated by epitaxially growing elements of III–V group on a GaAs substrate. Further, there has been proposed a method for fabricating a matrix of red light emitting elements by arranging a plurality of red light emitting elements on the same substrate.

It has been demanded to further form, in addition to the red light emitting element, blue and green light emitting elements on the same substrate to obtain a three primary color light emitting element. However, with regard to light emission at room temperature, even when AlGaInP capable of emitting a light with a shortest wavelength is used, it can emit only a red light. A boron nitride (BN)-based compound semiconductor can emit a blue light. However, the BN-based compound semiconductor cannot have the same lattice constant as that of a GaAs or GaP substrate which is inexpensive and excellent in crystallinity and productivity and also easily available. Therefore, it has been difficult to fabricate a three primary color light emitting element by III–V group elements on the same substrate with a good productivity.

Meanwhile, when a II–VI group element is epitaxially grown on a GaAs substrate, a light emitting diode (LED) or laser diode (LD) capable of emitting a green light can be fabricated. The LED or LD made of the II–VI group element has a structure wherein, for example, a $(Cd_{0.2}Zn_{0.8})Se$ layer is sandwiched between ZnSe layers.

The assignee of the present application has previously proposed in Japanese Patent Application No. 4-32253 or the like an LD or LED capable of emitting a blue light in which a ZnSe layer is sandwiched between ZnMgSSe layers.

A display device has been reported in which elements are arranged in a juxtaposition fashion. However, this display device has a one pixel size as relatively large as about 5 mm and thus has an entire display region as large as 10 inches or more. Thus, there have neither been suggested yet a display device wherein three primary color light emitting elements are formed on the same substrate nor a method for fabricating the display device.

OBJECTS AND SUMMARY OF THE INVENTION

It is therefore an object of the present invention to provide a novel semiconductor display device in which three primary color (R, G and B) light emitting portions of a self emission type are formed on the same substrate through a single crystal growth process by changing the composition of a compound semiconductor layer.

It is another object of the present invention to provide a method for fabricating a high definition display device of a self emission type by forming an active layer made of II–VI compound semiconductor while controlling the composition ratio of the active layer with use of a mask through a single crystal growth process.

It is a further object of the present invention to provide active layers for emitting three primary color lights, when a substrate having light shielding structures is employed, which are formed as a self-aligning structure through a single crystal growth process without using a mask, and also to provide a high definition display device of a self emission type using such active layers.

It is a further object of the present invention to provide a stable, reliable semiconductor display device in which a II–VI compound semiconductor is used as a growth layer, so that a lattice matching can be performed with a substrate made of GaAs or the like which is inexpensive and excellent in crystallinity and productivity and also easily available.

It is a further object of the present invention to provide a semiconductor display device of a projection type in which respective color light emitting portions are fabricated in the form of a one-dimensional array and an emitted light therefrom is scanned for projection.

It is a further object of the present invention to provide a high-definition, small-size display of a self emission type having a size of 3 inches or smaller in which three primary color light emitting portions are arranged and integrated on a substrate in the form of, e.g., a two-dimensional matrix.

It is a further object of the present invention to provide a high-definition, small-size display device of a self emission type wherein light emitting elements constituted by laser diodes are subjected to anisotropic etching process such as a reactive ion beam etching (RIBE) process to form a mirror surface made at an angle of 45 degrees with respect to their end surface to thereby form a surface light emission structure, and the light emitting elements are arranged and integrated in the form of a two-dimensional matrix.

As an aspect of the present invention, a light emitting device is comprised of a substrate, a first cladding layer provided on the substrate, red, green and blue light emitting portions each made of II–VI semiconductor and formed in parallel to a surface of the substrate on the first cladding layer, and a second cladding layer provided on the light emitting portions, wherein each of the red, green and blue light emitting portions contains at least one of Zn and Cd, and Zn compositions of the respective light emitting portions are increased in the order of the red, green and blue light emitting portions.

As another aspect of the present invention, a method for fabricating a light emitting element is comprised of the steps of forming a first cladding layer on a substrate, forming red, green and blue light emitting portions each made of II–VI semiconductor in a horizontal direction with respect to a surface of the substrate on the first cladding layer, forming a second cladding layer on the light emitting portions, and electrically separating the red, green and blue light emitting portions from each other.

The preceding and other objects, features, and advantages of the present invention will become apparent from the following detailed description of illustrative embodiments thereof when read in conjunction with the accompanying drawings, in which like reference numerals are used to identify the same or similar parts in the several views.

BRIEF DESCRIPTION OF THE DRAWINGS

FIG. 11 is a schematic diagram showing an arrangement of a display apparatus using the one-dimensional array according to the present invention;

FIG. 14A is a schematic diagram showing a manufacturing process according to the third embodiment of the present invention;

FIG. 14B is a schematic diagram showing another manufacturing process according to the third embodiment of the present invention; and FIG. 14C is a schematic diagram showing a further manufacturing process according to the third embodiment of the present invention.

DETAILED DESCRIPTION OF THE PREFERRED EMBODIMENTS

A light emitting device or display device according to a first embodiment of the present invention will now be described with reference to FIGS. 1 to 4. In the first embodiment, a blue light emitting portion is made of ZnSe, a green light emitting portion is made of (ZnCd)(SeTe), and a red light emitting portion is made of Cd(SeTe). The first embodiment shows an example of a light emitting device or display device in which these blue, green and red light emitting portions are sandwiched between n-type and p-type cladding layers of ZnSe or (MgZn)(SSe) to thereby form a three-primary-color emitting portions in the form of LEDs (light emitting diodes) or LDs (laser diodes).

Figure 1:
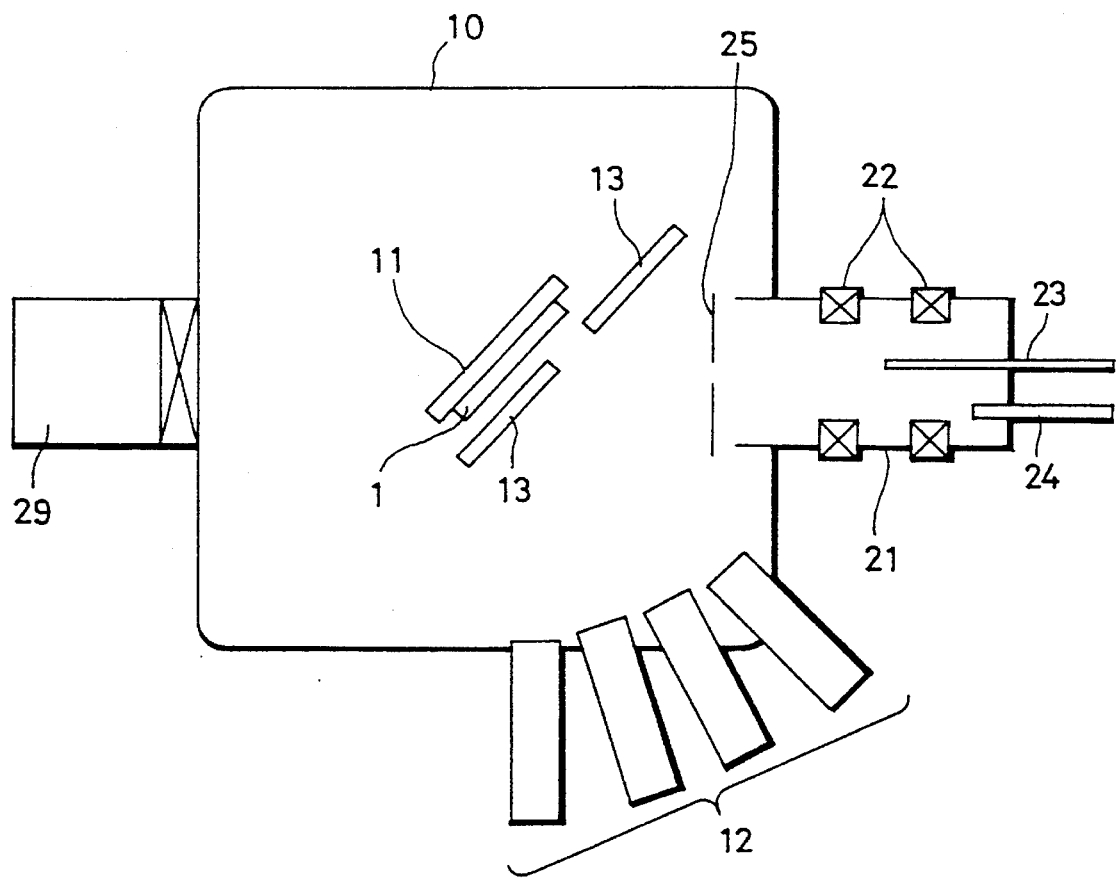
FIG. 1 is a schematic diagram showing an example of a crystal growing apparatus.

FIG. 1 shows an arrangement of a deposition apparatus based on molecular beam epitaxy (MBE) method as an example of a crystal growing apparatus. Referring to FIG. 1, a vacuum chamber 10 is set to have an ultra-high vacuum level of about $10^{-7}$ Torr or lower. A substrate holder 11 for holding a substrate 1 thereon is mounted within the vacuum chamber 10. At locations opposed to one surface of the substrate 1 supported by the substrate holder 11, there are provided a plurality of molecular beam sources or K cells 12 and a plasma generator 21 based on radio frequency (RF) or electron cyclotron resonance (ECR). Reference numeral 22 denotes a magnet, 23 denotes a microwave terminal, 24 denotes a gas introduction pipe for introducing a gas such as an $N_2$ gas into the vacuum chamber 10 therethrough, and 25 denotes a shutter.

In order to control compositions Cd and Zn, for example, two sheets of masks 12 are disposed between the substrate 1 and the molecular beam sources 12. The masks 13 are arranged so as to be opened or closed in synchronism with the shutter 25 of the plasma generator 21.

Crystal growth of the three-primary color emitting portions is carried out by using the crystal growing apparatus in accordance with the following processes. This example shows the case that the three-primary color emitting portions are constructed as LEDs.

Initially, high purity Zn, Cd, S, Se and Te serving as materials as well as Cl serving as a dopant are filled in the respective molecular beam sources 12. FIG. 1 shows only four molecular beam sources 12 for simplicity. The substrate 1 made of GaAs or the like and having a cleaned surface is mounted on the substrate holder 11. Subsequently, an air within the vacuum chamber 10 is exhausted to a vacuum level of about $10^{-8}$ Pa and the molecular beam sources 12 are adjustably heated to obtain suitable intensities of molecular beams.

Subsequently, the substrate 1 is heated to about 600° C. to further clean the surface of the substrate. Thereafter, temperature of the substrate temperature is lowered to about 300° C. to start the growth of a compound semiconductor layer. In this case, when crystal growth of n-type crystal is desired, a Cl beam is irradiated from the molecular beam sources 12. When it is desired to start crystal growth of p-type crystal, the masks 13 and the shutter 25 are opened in synchronism with each other and simultaneously an N plasma is irradiated from the plasma generator 21 to cause the growth of the respective n-type and p-type crystals.

Figure 2:
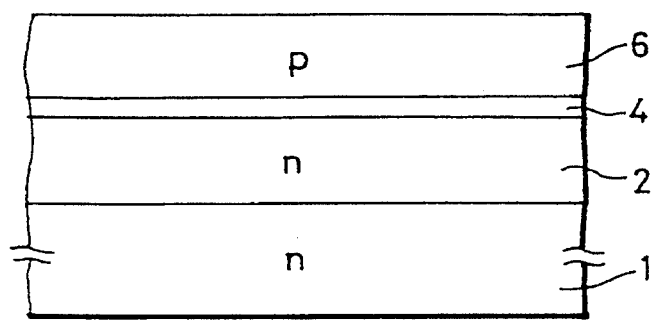
FIG. 2 is a schematic diagram used to explain a process for manufacturing a light emitting device according to a first embodiment of the present invention.

In this embodiment, as shown in FIG. 2, an n-type ZnSe material is grown on the substrate 1 as a cladding layer 2 of a first conductivity type, and then ZnSe—(CdZn)(SeTe) are deposited on the cladding layer 2 to thereby form a light emitting layer 4 of a multi-quantum well (MQW) structure as will be described below. The emission light color of the light emitting layer 4 can be varied by changing a composition ratio between Cd and Zn. For example, red, green and blue lights can be emitted when the layer 4 is grown so that an atomic ratio of Cd is set to be 100%, 20% and 0%, respectively.

In the illustrated example, in order to control the composition of the light emitting layer 4, the Zn(SeTe) and Cd(SeTe) are alternately grown by using the two masks 13 in the apparatus of FIG. 1. More specifically, after Se and Te beams are irradiated, a Zn beam is irradiated through the mask on the light emitting layer. In this case, the Zn beam is irradiated on the light emitting layer through stripe-shaped slots of the mask, so that an area of the light emitting layer irradiated with a large intensity of the Zn beam has a large Zn concentration to thereby form a blue light emitting portion 4b.

Further, after the Se and Te beams are irradiated, when a Cd beam is irradiated through the mask on the light emitting layer, the Cd beam is similarly irradiated through stripe-shaped slots of the mask. Accordingly, an area of the light emitting layer irradiated with a large intensity of the Cd beam has a large concentration of Cd to thereby form a red light emitting portion 4r.

An area of the light emitting layer irradiated with both the Cd and Zn beams through the mask forms a green light emitting portion 4g.

Figure 3:
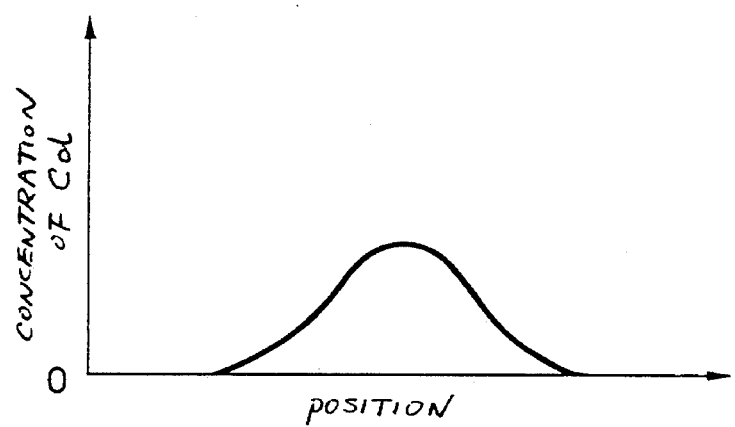
FIG. 3 is a diagram showing distribution characteristics of Cd concentration.

The light emitting layer thus obtained has such a distribution curve of Cd concentration as partly shown in FIG. 3. That is, concentration of Cd is progressively increased and decreased along lateral direction of the element in FIG. 4 and, at its peak, the II group element is composed only by Cd. Such a distribution cyclically appears on the substrate 1 in the form of a cyclically repeated concentration distribution. A cladding layer 6 of a second conductivity type made of p-type ZnSe or the like is grown on the light emitting layer 4. Thereafter, an electrode 8A is deposited on the entire surface of the cladding layer 6 of the second conductivity type by sputtering process or the like, and then the respective light emitting portions are separated. That is, grooves 9 are formed in the layers 2, 4 and 6 by a photoresist coating, a mask lithography and etching process such as a wet etching or reactive ion etching (RIE) with use of the mask having the aforementioned stripe-shaped slot pattern to form grooves 9 therein. Further, an electrode layer 8B is formed on the entire rear surface of the substrate 1 by sputtering process or the like, whereby a semiconductor display device as shown in FIG. 4 is obtained.

In this case, the electrodes 8A and 8B are formed and interconnected as light-transmittive electrodes such as thin metallic electrodes or transparent electrodes made of indium tin oxide (ITO), i.e., composite oxide of In and Sn.

Figure 5A:
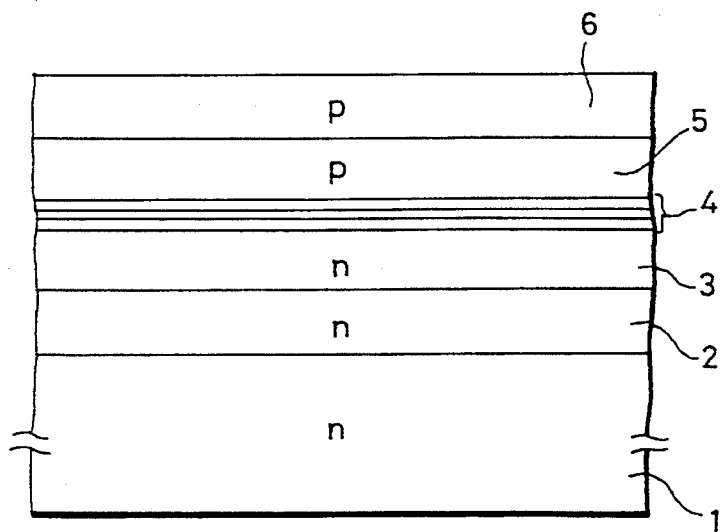
FIG. 5A is a schematic diagram used to explain a process of manufacturing a light emitting device according to a second embodiment of the present invention.
Figure 5B:
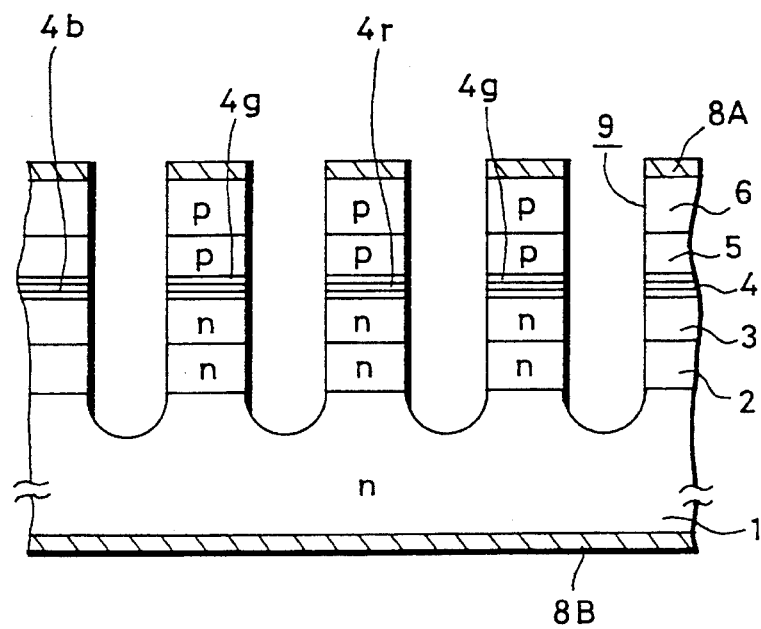
FIG. 5B is a schematic diagram used to explain another manufacturing process according to the second embodiment of the present invention.

The light emitting device or display device according to the second embodiment of the present invention will be described with reference to FIGS. 5A and 5B showing the manufacturing processes thereof. In this case, the light emitting layer is formed as laser diodes (LDs). As shown in FIG. 5A, on a substrate 1 made of, e.g., n-type GaAs or the like, a cladding layer 2 of n-type (MgZn)(SSe), a guide layer 3 made of n-type ZnSSe or ZnSe, a light emitting layer 4 of a MOW structure of ZnSe—(ZnCd)(SeTe) sublayers, a guide layer 5 made of p-type ZnSSe or ZnSe, and a cladding layer 6 made of p-type (MgZn)(SSe) are sequentially epitaxially grown by using the apparatus of FIG. 1.

Figure 4:
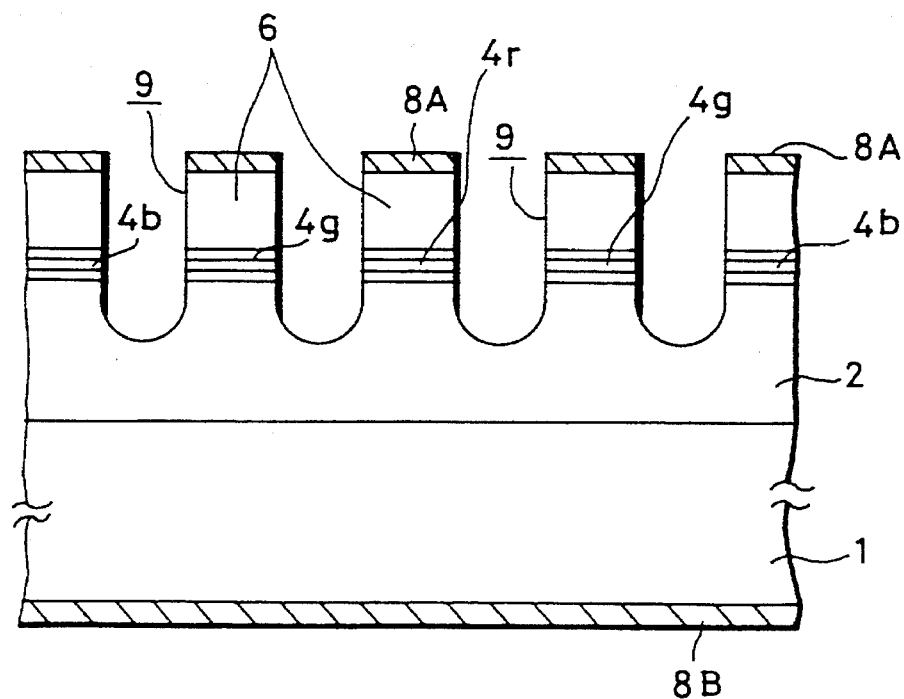
FIG. 4 shows a schematic cross-sectional view of the light emitting device according to the first embodiment of the present invention.

In this case, like the embodiment shown in FIG. 4, the composition of the light emitting layer 4 is crystal-grown by passing Zn and Cd molecular beams partially through masks 13, and the beams are irradiated on the substrate 1 to thereby modify the concentrations thereof.

In this way, a blue light emitting portion 4b, a green light emitting portion 4g, a red light emitting portion 4r, a green light emitting portion 4g, a blue light emitting portion 4b, . . . are sequentially formed as shown in FIG. 5B. Thereafter, an electrode layer 8A is deposited on the cladding layer 6 of the second conductivity type, and then grooves 9 for separating the respective color light emitting portions 4b, 4g and 4r are formed by photolithography process or the like. Further, an electrode layer 8B is deposited on the rear side of the substrate 1, and then a light emitting end face is formed by cleavage technique or the like to thereby form an LD device of three-primary color light emitting portions.

Figure 6:
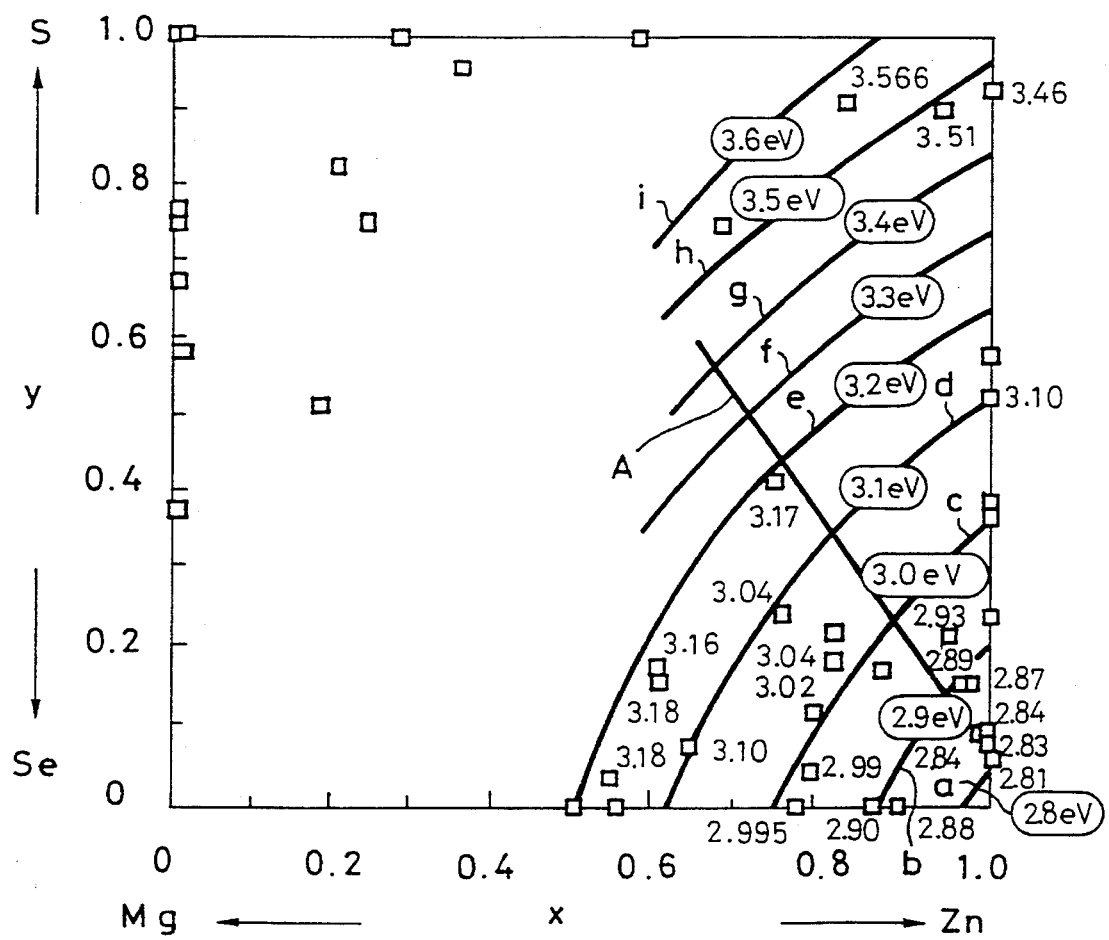
FIG. 6 is a diagram showing a variation in band gap with respect to variations in x and y compositions in $(Zn_xMg_{1-x})(S_ySe_{1-y})$.

In this case, as already explained with reference to Japanese Patent Application No. 4-32253 filed by the same assignee of the present application, lattice matching with the GaAs substrate 1 can be realized by suitably selecting a composition ratio of Zn, Mg, S, and Se. FIG. 6 shows a band gap Eg(eV) of a photoluminescence (PL) spectrum obtained from band end emission with respect to different materials in (ZnxMg1-x) and (SySe1-y) when the composition ratios x and y of the (ZnxMg1-x) and (SySe1-y) are varied at open squares.

In FIG. 6, the lattice matching with the GaAs substrate 1 is attained when the composition ratio is selected at a position on a straight line A. Curves a to i each schematically shows composition ratios at which a band gap of 2.8 to 3.6 eV is obtained.

As will be seen from FIG. 6, when the values x and y of the composition ratio of the (MgZn) and (SSe) are selected to lie on the straight line A to thereby cause the crystal growth of the cladding layers 2 and 6, the cladding layers can be lattice-aligned with the substrate 1. When the cladding layers are lattice-aligned with the substrate 1, the light emitting portion can be arranged so that characteristics thereof, such as luminous efficiency, can be improved and further stable operation and continuous oscillation thereof can be realized.

Even in this case, the guide layers 3 and 5 may be made of ZnS. However, when ZnSSe is used and, in particular, the composition of $ZnS_{0.06}Se_{0.94}$ is selected, perfect lattice alignment with the substrate can be realized.

A third embodiment of the present invention will be described below.

Figure 7:
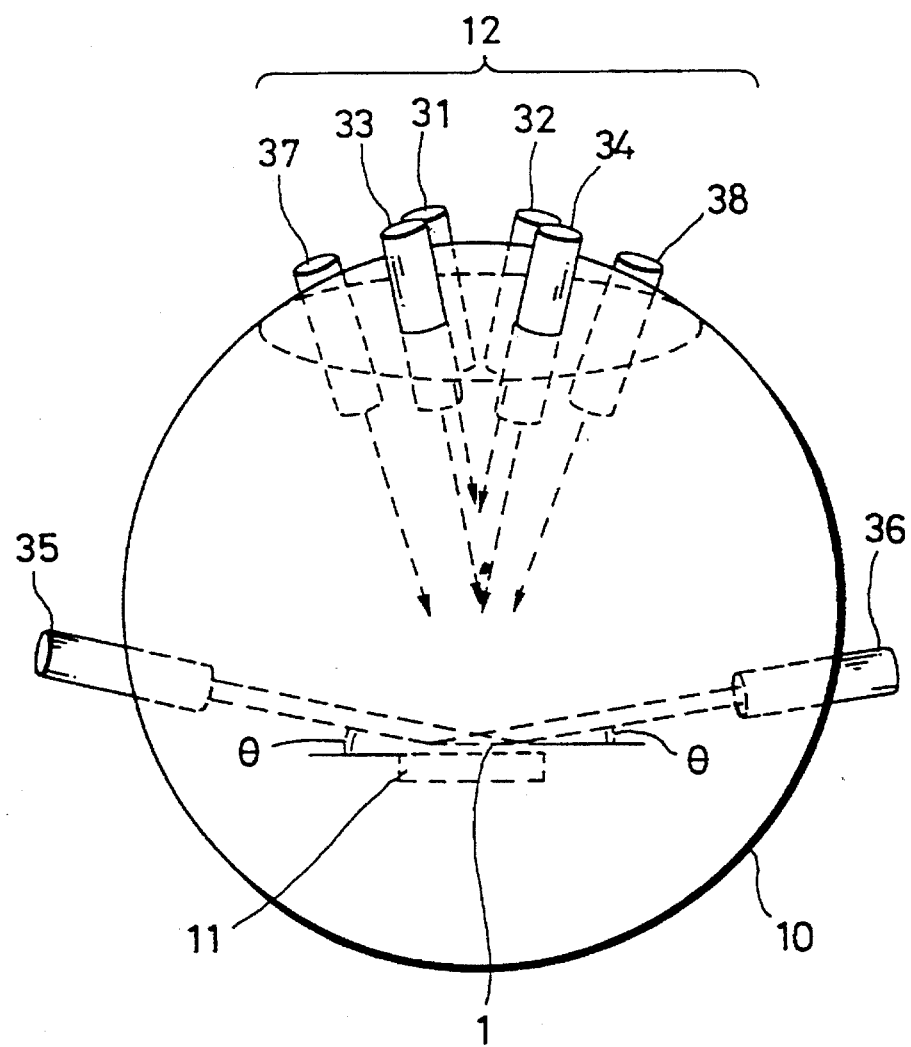
FIG. 7 is a schematic diagram showing an arrangement of an example of a deposition apparatus.

FIG. 7 shows a schematic arrangement of a deposition apparatus based on an MBE method which is used in the third embodiment as an example. In this case, a substrate holder 11 holding a substrate 1 thereon is disposed within a vacuum chamber 10 which is kept at an ultra-high vacuum level of $10^{-7}$ Torr or less. A molecular beam source 12 having a group of molecular beam sources 31 to 38 is disposed at a position opposed to the surface of the substrate 1 held on the substrate holder 11. More in detail, the molecular beam source 12 includes a Zn molecular beam source 31, an Mg molecular beam source 32, an S molecular beam source 33, a nSe molecular beam source 34, a Cl molecular beam source 37 as an n-type impurity source, and an N molecular beam source 38 as a p-type impurity source, which are positioned so that these beams are directed to the surface of the substrate substantially perpendicularly thereto. In this connection, an N gas as the p-type impurity source may be introduced into the vacuum chamber 10 from the plasma generator 21 used in the first embodiment by means of plasma decomposition or the like.

In this case, in particular, the molecular beam sources 35 and 36 are disposed at such positions that the beams therefrom form a predetermined angle θ with respect to the plane of the surface of the substrate 1 held on the substrate holder 11. The molecular beam source 35 is filled with Zn while the molecular beam source 36 is filled with Cd.

Figure 8A:
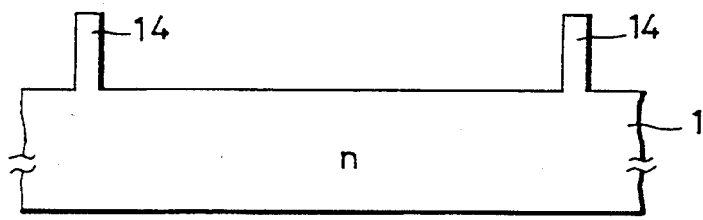
FIG. 8A is a schematic diagram showing a manufacturing process of a light emitting device according to a third embodiment of the present invention.
Figure 8B:
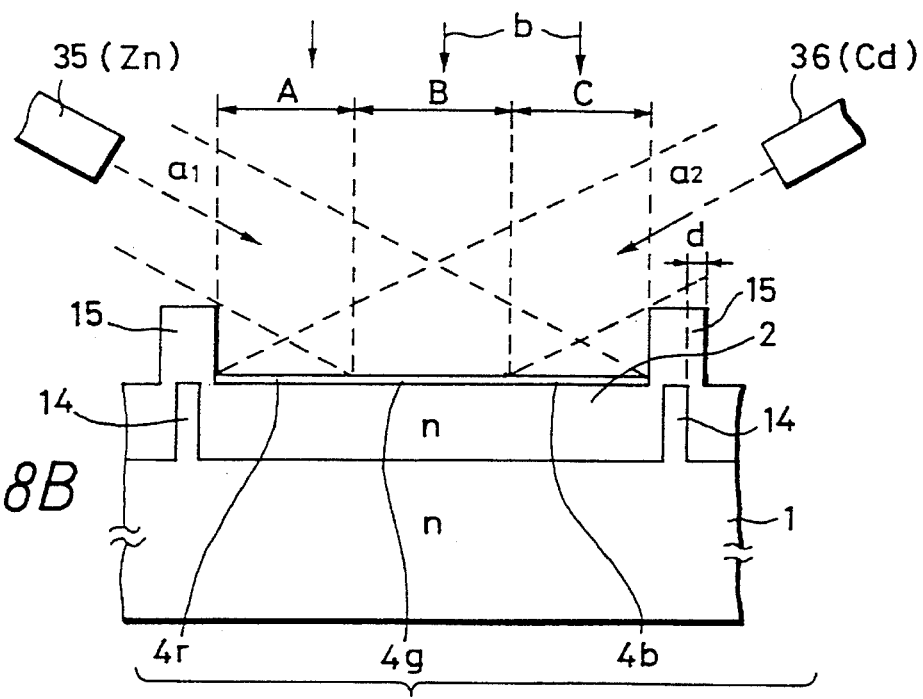
FIG. 8B is a schematic diagram showing another manufacturing process according to the third embodiment of the present invention.
Figure 8C:
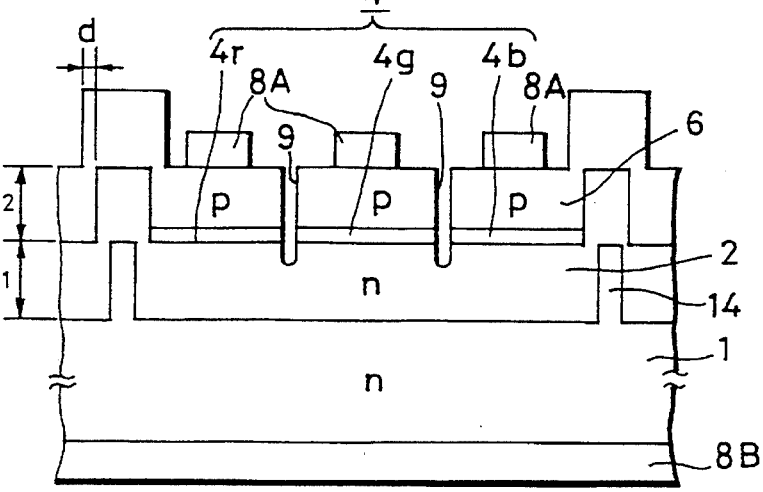
FIG. 8C is a schematic diagram showing a further manufacturing process according to the third embodiment of the present invention.

Crystal growth is carried out by using such an apparatus as shown in FIG. 7 in accordance with manufacturing processes shown in FIGS. 8A to 8C, for example. As already explained in FIG. 7, the molecular beam sources 31–34, 37 and 38 are filled with high purity Zn, Cd, Mg, S, Se, Cl and N respectively. Thereafter, as shown in FIG. 8A, a substrate 1 having light shielding structures 14 is prepared, subjected to a cleaning operation over the surface thereof, and mounted on the substrate holder 11 shown in FIG. 7. Under such a condition, an air within the vacuum chamber 10 is exhausted by a predetermined air evacuating means (not shown) to a vacuum level of about 10 to 8 Pa.

Figure 9:
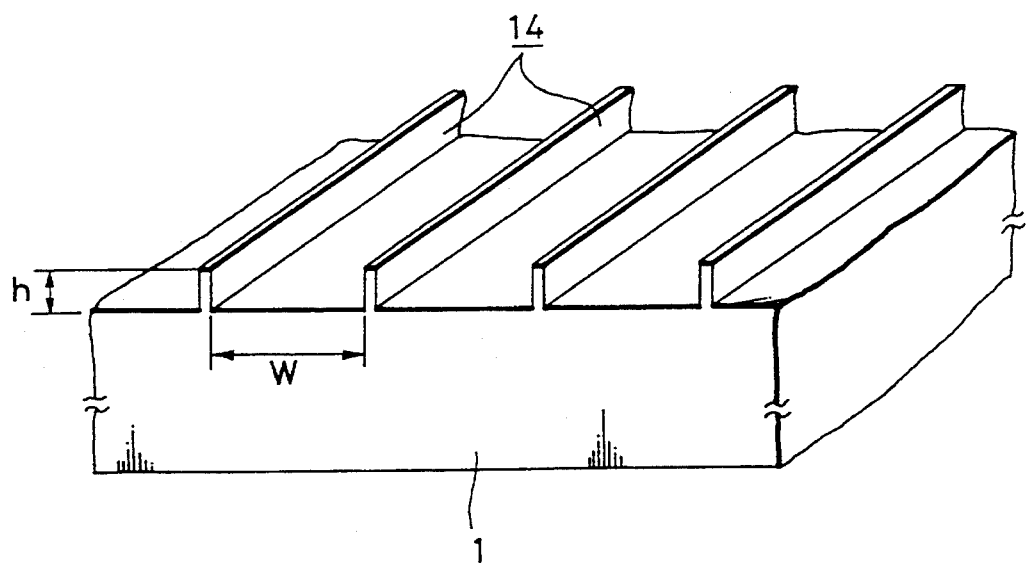
FIG. 9 is a schematic diagram showing yet a further manufacturing process according to the third embodiment of the present invention.

The light shielding structures 14 are cyclically formed on the substrate 1 made of n-type GaAs or the like in, e.g., a stripe-shaped fashion by photolithography process or the like, as shown in FIG. 9, for example. In the illustrated example, the stripe-shaped light shielding structures 14 were formed to have a height of about 1 μm and to be spaced by an interval W of about 30 μm therebetween.

Next, the molecular beam sources 31–36 are adjustably heated so as to obtain suitable intensities of molecular beams. The substrate 1 is heated to about 600° C. to further clean the surface thereof. Thereafter, the substrate temperature is lowered to about 300° C. and then a cladding layer 2 of the first conductivity type made of, e.g., ZnMgSSe is grown on the substrate as shown in FIG. 8B. In this case, a Cl beam is irradiated from the Cl molecular beam source 37 to dope n-type impurities into the cladding layer 2. Further, in this case, shielding portions 15 are periodically formed so as to cover the respective light shielding structures 14 and have shapes respectively corresponding thereto. An amount d of each shielding portion 15 not-overlapped on the corresponding light shielding structure 14 is about several 10s of nanometers.

Further, a light emitting layer 4 is grown on the cladding layer 2 by using the upper molecular beam sources, that is, the Se molecular beam source and the molecular beam sources 35 and 36. In this case, molecular beams shown by arrows a1 and a2 respectively emitted from the molecular beam sources 35 and 36 are irradiated slantingly on the layer 4 since these sources are positioned at the predetermined angle θ with respect to the surface of the substrate 1. Accordingly, in a left-side zone A on the layer 4 in FIG. 8B, the molecular beam emitted from the molecular beam source 35 is shielded. In the zone A, a red light emitting layer of CdSe is formed in the layer 4 by a Zn molecular beam shown by an arrow b irradiated from its upper side and the Cd molecular beam shown by the arrow a2 irradiated from its right side.

In a zone B of the layer 4, a green light emitting layer of ZnCdSe is formed by the Zn, Se and Cd molecular beams emitted from its upper side molecular beam source and from its left- and right-side molecular beam sources. In a zone C of the layer 4, the molecular beam emitted from the molecular beam source 36 is shielded, so that a blue light emitting layer of ZnSe is formed by the Se molecular beam emitted from its upper side and the Zn molecular beam shown by the arrow a1 emitted from its left side.

Thereafter, a cladding layer 6 of the second conductivity type made of ZnMgSSe entirely doped, e.g., with N as a p-type impurity is epitaxially grown all over the surface of the active layer. An electrode layer 8A is deposited on the entire surface of the cladding layer 6 by sputtering process. Then, as shown in FIG. 8C, grooves 9 are formed in the layers 2, 4 and 6 by photolithography process, i.e., a coating of photoresist, a mask lithography, and etching process, such as a reactive ion etching so that the respective light emitting layers are separated by the grooves 9. Further, an electrode layer 8B is deposited on the entire rear surface of the substrate 1 by a sputtering process or the like. Accordingly, a semiconductor device of a self luminous type having three primary color (R, G and B) light emitting portions can be formed without using a mask.

In this case, the electrodes 8A and 8B are formed and interconnected respectively in the form of light-transmissive electrodes such as thin metallic electrodes or as a transparent layer made of indium tin oxide (ITO), i.e., composite oxide of In and Sn.

In the third embodiment, in order to reliably and partially shield the molecular beams emitted from the respective molecular beam sources 35 and 36 by the light shielding structures 14, it is desirable to select the angle θ of the molecular beam sources 35 and 36 with respect to the surface of the substrate 1 to be almost $\tan^{-1}(h/w)$, wherein reference symbol w denotes the width of the respective color light emitting layers between the adjacent light shielding structures 14 and symbol h denotes the height of the light shielding structures 14. In the above example, since the height h of the light shielding structure 14 is about 1 μm and an interval W between the light shielding structures 14 is about 30 μm, the width w of the respective color light emitting layers becomes about 10 μm. When the angle θ of disposition of the molecular beam sources 35 and 36 is set to be about 5.7° (degrees), the composition modification of the respective color light emitting layers 4r, 4g and 4b can be reliably carried out.

In the foregoing first, second and third embodiments, the cladding layers 2 and 6 may be made of ZnSSe instead of only ZnS. In particular, when the composition ratio between the S and Se in ZnSSe is selected to be $ZnS_{0.06}$ and $Se_{0.94}$, perfect lattice matching with the substrate 1 can be attained.

Further, when only Se may be used in the respective light emitting portions as VI group elements, the blue light emitting portion may be made of ZnSe, the green light emitting portion may be made of ZnCdSe, and the red light emitting portion may be made of CdSe.

Further, when a Te molecular beam source, for example, may be disposed within the vacuum chamber 10, the red light emitting layer 4r may be made of CdSeTe and the green light emitting layer 4g may be made of ZnCdSeTe.

Figure 10:
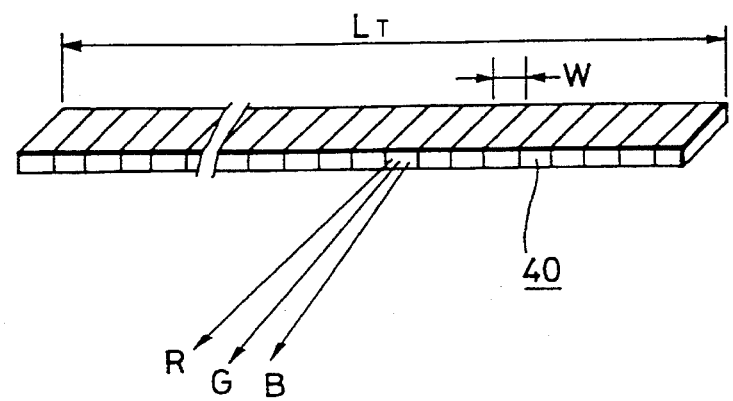
FIG. 10 is a schematic diagram showing a light emitting device arranged in a one-dimensional array fashion in accordance with the present invention.

When about 1000 of the thus obtained three primary color light emitting portions are arranged in the form of a one-dimensional array as a light emitting element 40 as shown in FIG. 10, a semiconductor display device having a length LT of about 3 mm is constructed.

Further, as shown in FIG. 11, a light emitted from the light emitting element 40 may be reflected by a polygonal reflecting mirror 41 so that the mirror is scanned by the light in the direction perpendicular to the orientation direction of the one-dimensional array with the rotation of the mirror and then the reflected light is irradiated onto a reflecting mirror 42 to scan thereon. Light reflected by the reflecting mirror 42 is projected on to a rear side of a screen 43, i.e., to a side of the screen opposite to such a side shown by s that the viewer can visually confirm a display, such as a video image. With such an arrangement as mentioned above, a projection type display apparatus of a so-called a rear projection type can be configured. In FIG. 11, reference numeral 44 denotes an apparatus body.

Figure 12:
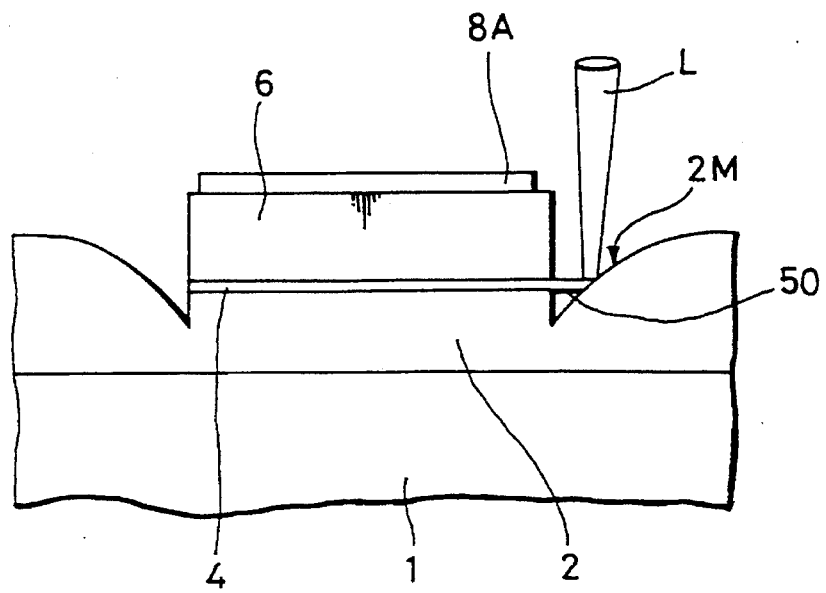
FIG. 12 shows a schematic cross-sectional view of a main portion of a light emitting device according to the present invention.

Further, in the case of forming the light emitting device as a laser diode as shown by a cross-sectional view of the light emitting device in FIG. 12, when a light emitting end face 50 of the diode is formed by, for example, reactive ion beam etching (RIBE) process or reactive ion etching (RIE) process under a high voltage, such a mirror surface 2M can be made spontaneously which opposes to the end face 50 and has an angle of about 45° with respect to the substrate 1 and the end face 50. This technique is disclosed in, for example, Japanese Patent Application No. 4-326840 filed by the same assignee of the present application).

A light L emitted from an active layer 4 can be directed in the direction substantially perpendicular to the surface of the substrate 1 by the mirror surface 2M.

Figure 13:
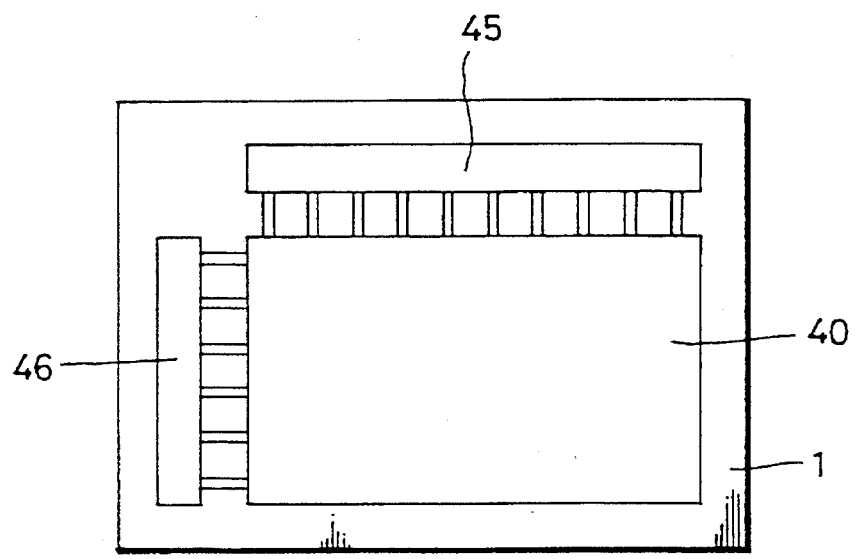
FIG. 13 is a schematic diagram showing an arrangement of a display device using a two-dimensional array according to the present invention.

Accordingly, when a plurality of such light emitting elements each having the three primary color light emitting layers 4r, 4g and 4b are arranged and integrated in the form of, for example, a two-dimensional matrix, a small size display of a self luminous type can be obtained. For example, as shown in FIG. 13, when a plurality of such light emitting elements as mentioned above are arranged on the same substrate 1 in the form of a two-dimensional matrix to form a light emitting device 40 and horizontal and vertical scanning circuits 45 and 46 are formed on the same substrate 1 so that the light emitting devices sequentially emit lights in accordance with a video signal, for example, a small-size, high-definition display unit can be obtained.

In the case of forming a one- or two-dimensional matrix in the third embodiment, it is desired to carry out the patterning operation without causing any breaking of the wired circuit of the electrode layer or the like. To this end, the stripe-shaped projections inevitably generated by the crystal growth due to the light shielding structures 14 in the second embodiment can be easily removed in accordance with the following processes shown in FIGS. 14A to 14C. In FIGS. 14A to 14C, like parts corresponding to those in FIGS. 8A to 8C are denoted by the same reference numerals and symbols and therefore need not be described in detail.

More specifically, as shown in FIG. 14A, a resist 51 is deposited on a cladding layer 6 so that projections 52 above the light shielding structures 14 are exposed at their top surfaces, then the resist 51 is subjected to a shallow exposure all over the surface thereof in such a manner as shown by a slanted line. Thereafter, a developing operation is performed to exposingly project the projections 52 under the condition that the electrodes 8A on the active layer 4 is still covered with the resist 51 as shown in FIG. 14B, and then an anisotropic etching such as a RIE is performed all over the surface thereof, which results in that the top surfaces of the light shielding structures 14 can be made substantially flat as shown in FIG. 14C.

Alternatively, the resist may be thickly deposited on the cladding layer 6 and then flattened at the surface thereof, and thereafter etching process may be performed all over the surface thereof to make the tops of the light shielding structures flat.

In the light emitting devices obtained according to the first and second embodiments, the stripe-shaped respective color light emitting portions 4r, 4g and 4b are formed in the order of blue, green, red, blue, green, red, . . . When the widths of the respective light emitting portions are suitably changed, a desired ratio between the light emission intensities of the light emitting portions can be obtained. Accordingly, a white balance can be easily adjusted.

Further, when it is desired to form LED type light emitting portions in the present invention, the cladding layer 6 of the second conductivity type may not be provided on the light emitting portions 4r, 4g and 4b, for example, in the above example.

The present invention is not limited to such arrangements but may be modified in various ways. For example, the foregoing arrangement using the screen 43 can be modified to a so-called projector type display apparatus which does not use the screen 43 and provides a display on a large size screen located at a far distance.

With such an arrangement, when a plurality of laser beam emitting portions are juxtaposed in the form of a one-dimensional array and scanned, e.g., in one direction, the emitting portions can be realized as a projection type display device. Further, a plurality of LD type light emitting portions can be arranged in the form of, e.g., a surface emission structure or a two-dimensional matrix so that an image is directly projected therefrom.

In this way, even when LD type light emitting portions are employed as the light emitting portions, high-definition display device of a self luminous type can be obtained through only single crystal growth process. In this case, it is possible to miniaturize the device in size to about 3 inches or smaller. Further, the small-size display device can be used as a light projection part in a projection type display apparatus. Furthermore, when the LD type light emitting portions are arranged in the form of a surface emission structure, there can be realized a projection type display device having a display size of, e.g., about size A4 (297×210 mm).

It will be appreciated that the present invention is not limited to the aforesaid embodiments but various materials may be employed and the invention may be modified in various ways. For example, a buffer layer may be provided between the substrate 1 and the cladding layer 2 of the first conductivity type. In addition, the manufacturing method of the present invention is not limited to the aforesaid fabricating methods and various crystal growing methods may be employed therefor.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A light emitting device comprising:

a substrate;

a first cladding layer provided on said substrate;

red, green and blue light emitting portions each made of II–VI semiconductor and formed in parallel to a surface of said substrate on said first cladding layer; and a second cladding layer provided on said light emitting portions, wherein each of said red, green and blue light emitting portions contains at least one of Zn and Cd, and Zn compositions of said respective light emitting portions are increased in the order of said red, green and blue light emitting portions.

2. A light emitting device according to claim 1, wherein said red light emitting portion contains Cd as a II group element thereof, said green light emitting portion contains Zn and Cd as a II group element thereof and said blue light emitting portion contains Zn as a II group element thereof.

3. A light emitting device according to claim 2, wherein said red light emitting portion is made of Cd—(Se,Te).

4. A light emitting device according to claim 2, wherein said green light emitting portion is made of (Zn,Cd)—(Se, Te).

5. A light emitting device according to claim 2, wherein said blue light emitting portion is made of Zn—(Se,Te).

6. A light emitting device according to claim 1, wherein said light emitting portions have a multi-quantum well structure.

7. A light emitting device according to claim 1, wherein said first and second cladding layers are made of ZnMgSSe.

8. A light emitting device according to claim 1, further comprising a light shielding structure formed on said substrate.

9. A light emitting device comprising a plurality of said light emitting portions according to claim 1 arranged in a one-dimensional array.

10. A light emitting device comprising a plurality of the light emitting portions according to claim 1 arranged in a two-dimensional array.

* * * * *